(12) United States Patent
Yeh et al.

(10) Patent No.: US 7,798,818 B2
(45) Date of Patent: Sep. 21, 2010

(54) ELECTRICAL CONNECTOR WITH IMPROVED HOUSING

(75) Inventors: Cheng-Chi Yeh, Tu-cheng (TW); Nan-Hung Lin, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 125 days.

(21) Appl. No.: 12/156,862

(22) Filed: Jun. 4, 2008

(65) Prior Publication Data

US 2008/0299795 A1    Dec. 4, 2008

(30) Foreign Application Priority Data

Jun. 4, 2007    (TW) ............... 96209154 U

(51) Int. Cl.
*H01R 12/00*    (2006.01)
(52) U.S. Cl. .......................... 439/71; 439/69
(58) Field of Classification Search ............ 439/68, 439/70, 71, 330
See application file for complete search history.

(56) References Cited

U.S. PATENT DOCUMENTS

| | | | | |
|---|---|---|---|---|
| 5,022,869 A * | 6/1991 | Walker | ................. | 439/526 |
| 5,378,970 A * | 1/1995 | Sato | ................. | 324/158.1 |
| 6,174,174 B1 * | 1/2001 | Suzuki et al. | ................. | 439/71 |
| 6,872,083 B2 * | 3/2005 | Kanesashi | ................. | 439/73 |
| 7,108,535 B1 * | 9/2006 | Mingviriya | ................. | 439/331 |

\* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

An electrical connector (1) for interconnecting integrated circuits (ICs) to a circuit board, includes an insulative housing (2, 3) defining a plurality of passageways extending therethrough, and a plurality of contacts received respectively in each of the passageways of the insulative housing. The insulative housing has a first base (2) adapted to connecting an IC to a circuit board and a second base (3) which is capable of cooperating with said first base when the connector is used to connecting another IC having a different size to the circuit board.

12 Claims, 3 Drawing Sheets

ELECTRICAL CONNECTOR WITH IMPROVED HOUSING

BACKGROUND OF THE INVENTION

1. Field of the Invention

The present invention generally relates to an electrical connector, and more particularly to an electrical connector connecting an IC to a printed circuit board.

2. Description of Related Art

Conventional IC sockets, which are employed to electrically connecting an IC to a printed circuit board, are usually designed to meet one size IC. While, in some circumstances, two or more different sizes of IC are needed to be used with a same mother printed circuit board. Cost will be increased if more sizes of IC sockets are designed and manufactured.

Therefore, an IC connector having an improved housing structure is desired.

BRIEF SUMMARY OF THE INVENTION

Accordingly, an object of the present invention is to provide an electrical connector having an improved housing which can selectively engage with ICs having different sizes.

In order to achieve the object set forth, an electrical connector for interconnecting integrated circuits (ICs) to a circuit board, includes an insulative housing defining a plurality of passageways extending therethrough, and a plurality of contacts received respectively in each of the passageways of the insulative housing. The insulative housing has a first base adapted to connecting an IC to a circuit board and a second base which is capable of cooperating with said first base when the connector is used to connecting another IC having a different size to the circuit board.

Other objects, advantages and novel features of the invention will become more apparent from the following detailed description of the present embodiment when taken in conjunction with the accompanying drawings.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there is shown in the drawings, embodiments which are presently preferred. It should be understood, however, that the present invention is not limited to the precise arrangements and instrumentality shown in the attached drawings.

DETAILED DESCRIPTION OF THE PREFERRED EMBODIMENT

Figure 1:
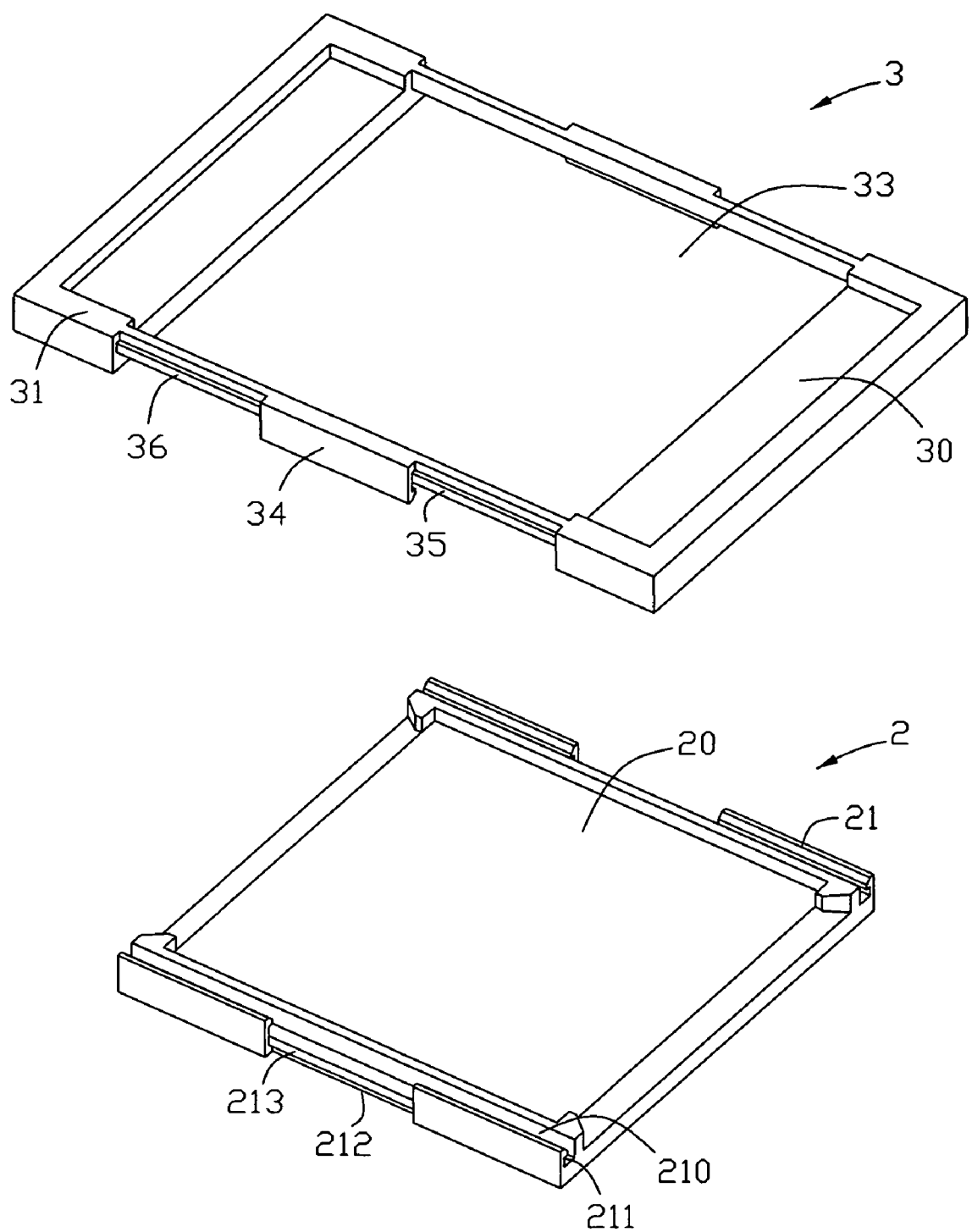
FIG. 1 is an exploded, perspective view of an IC socket in accordance with the present invention.

Reference will now be made to the drawing figures to describe the present invention in detail.

Figure 2:
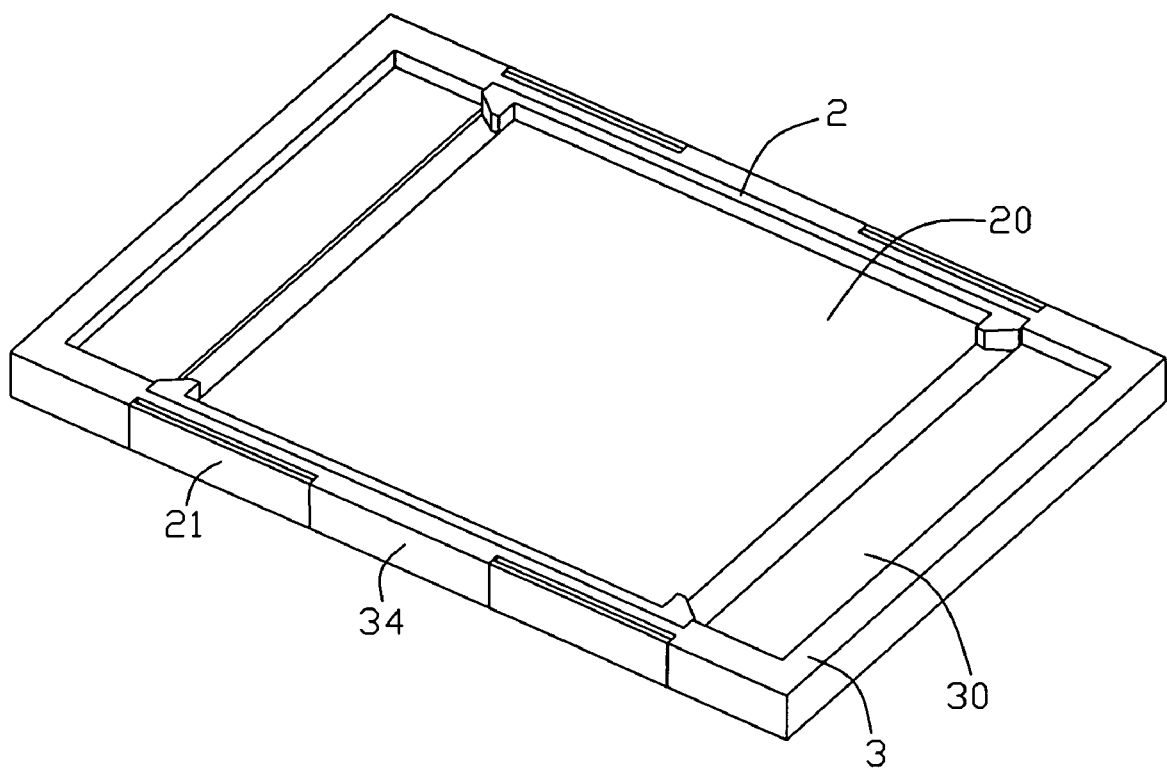
FIG. 2 is an assembled view of the IC socket shown in FIG. 1.
Figure 3:
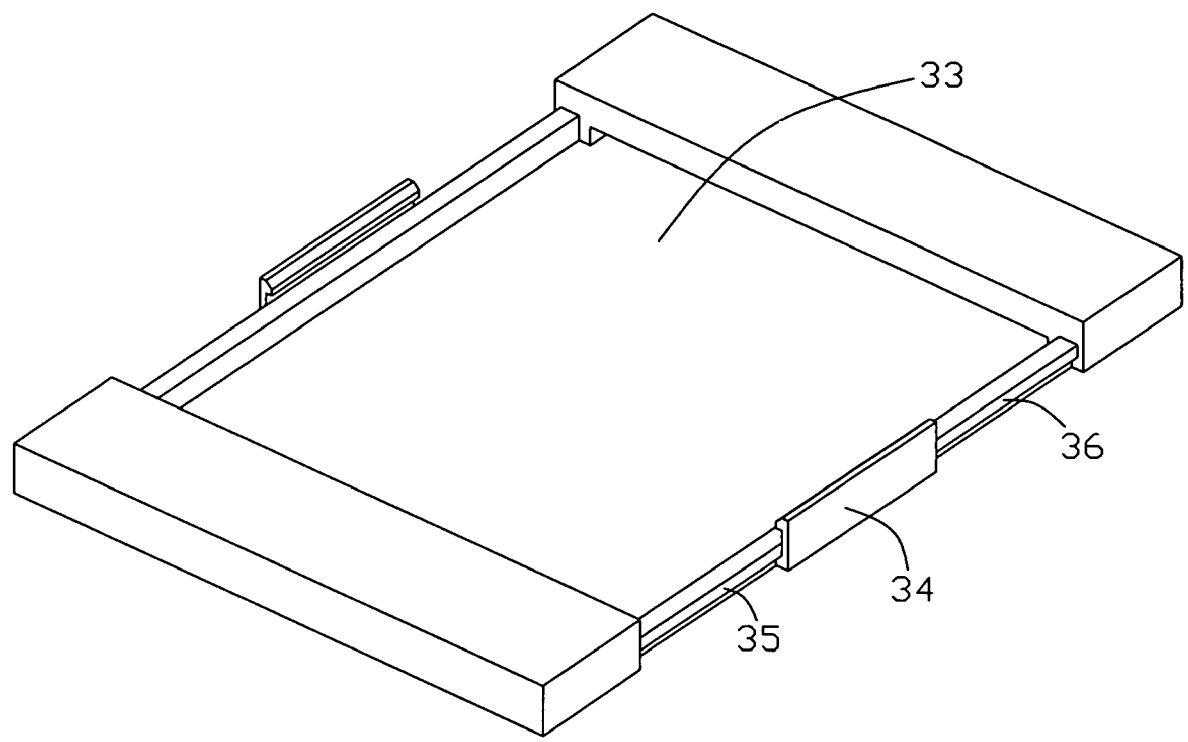
FIG. 3 is a perspective view of a second base of the IC socket.

FIGS. 1-3 shows an electrical connector 1 in accordance with the embodiment of the present invention. In the preferred embodiment, the electrical connector 1 can be an LGA connector mounted on a mother circuit board (not shown) for electrically connecting an IC (not shown) thereon. For simplicity reason, conventional known structures of an IC connector, for example, a cover and a lever etc, are not presented in the figures of the present application.

The electrical connector 1 comprises an insulative housing including a first base 2 and a second base 3. The first base 2 is configured in a flat, rectangular shape to receive thereon a first IC. The first base 2 defines a first receiving section 20 with a plurality of passageways (not shown) extending therethrough for receiving corresponding contacts (not shown). A pair of side walls 21 protrudes from opposite sides of the first base 2, each side wall defining a slot 210 therealong. A cutout 212 is defined on an outer peripheral side of the side wall beside the slot 210. A pair of latches 211 are formed adjacent the cutout 212 and a protrusion 213 extends within the cutout 212.

The second base 3 is also formed in a flat, rectangular shape with an opening 33 defined in a middle thereof. The sizes of opening 33 is coordinate with the size of the first base 2 to correspondingly receive the first base 2. The second base 3 defines a pair of receiving sections 30. Each receiving section 30 has a plurality of passageways (not shown) extending therethrough for receiving respective contacts (not shown) therein. When the connector 1 is employed to electrically connector a second IC having a size larger than the first IC, the first base 2 can be received in the opening 33 of the second base 3 and cooperates with the second base 3. It is easily to see that the separate first base 2 with the contacts can be used to connecting the first IC having a smaller size and the assembled first and second bases 2, 3 can used to connecting the second IC having a larger size. In other words, the present invention can co-work with two sizes of ICs on a same mother board, while no redesign is needed.

Referring to FIG. 1, in order to firmly assemble the first base 2 on the second base 3, a plurality of latch members are formed respectively. In detail, the second base 3 has a pair of side walls 31 corresponding to the side wall 21 of the first base 2. The side wall 31 can be partially received in the slot 210 of the side wall 21 of the first base 2. A latch 34 is formed in a middle of the side wall 31, which is received in the cutout 212 of the side wall 21 and abuts against the protrusion 213 of the cutout 212. A pair of cutouts 35 is defined on the side wall 31 for correspondingly engaging to the latches 211 of the side wall 21 of the first base 2. Similarly, each cutout 35 has a protrusion 36 formed therein and the latch 211 can abut against the protrusion 36. Understandably, other latch structures, which are used to securely connecting the first and the second bases 2, 3, are all fall in the scope of the present invention. In a preferred embodiment, each side wall 21, 31 of the first and the second bases 2, 3 has a outer face. When the two bases 2, 3 assembled together, the outer faces are coplanar with each other.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector for interconnecting integrated circuits (ICs) to circuit board, comprising:
    an insulative housing defining a plurality of passageways extending therethrough; and a plurality of contacts received respectively in each of the passageways of the insulative housing; wherein the insulative housing comprises a first base adapted for connecting an IC to a circuit board and a second base which is capable of cooperating with said first base when the connector is used for connecting another IC having a different size to the circuit board, the second base defining a central opening having a size conforming with and receiving the first base.

2. The electrical connector as claimed in claim 1, further comprising a metal frame, a cover and a lever assembled on said metal frame.

3. The electrical connector as claimed in claim 1, wherein the first base has a receiving section with side walls extending therefrom, and wherein a first plurality of passageways extend through the receiving section.

4. The electrical connector as claimed in claim 3, wherein the second base has a receiving section and side walls beside the receiving section, and wherein a second plurality of passageways extend through the receiving section.

5. The electrical connector as claimed in claim 4, wherein the first base and the second base are formed in a rectangular shape respectively, and wherein the second plurality of the passageways are arranged at opposite sides of the first plurality of the passageways.

6. The electrical connector as claimed in claim 4, wherein the side wall of the first base forms a first latch member and the side wall of the second base forms a second latch member, and wherein said first and said second latch members are engageable with each other to thereby firmly assemble the first and the second bases together.

7. The electrical connector as claimed in claim 6, wherein the first latch member includes a protrusion and the second latch member includes a latch engaging the protrusion.

8. The electrical connector as claimed in claim 6, wherein the first latch member includes a latch and the second latch member includes a protrusion, and wherein the latch engages the protrusion.

9. The electrical connector as claimed in claim 6, wherein the side wall of the first base defines a slot for partially receiving the side wall of the second base.

10. The electrical connector as claimed in claim 6, wherein each side wall of the first and the second bases defines an outside face, and wherein the outside faces are coplanar with each other when said first and said second base are assembled.

11. An electrical connector assembly for connecting integrated circuits (ICs) of different sizes to a circuit board, comprising:
   a frame mountable on the circuit board;
   a cover cooperating with the frame;
   a lever assembled on a side of the frame;
   a housing defining a receiving section and a plurality of contacts received in the receiving section, said receiving section having a first contour in compliance with a small size IC;
   a separate base assembled on the housing and having a second contour in compliance with a larger size IC.

12. An electrical connector for interconnecting integrated circuits (IC) of different sizes to a circuit board comprising:
   a base equipped with a plurality of contacts therewith and defining a first contour in compliance with a small size IC;
   a frame mountable on the circuit board defining a central through opening to not only receive said base therein but also expose the contacts downwardly; and
   complementary interengaging devices formed on both the base and the frame to assemble said base and said frame together; wherein
   said frame defining a second contour in compliance with a larger size IC.

* * * * *